(12) United States Patent
Robert

(10) Patent No.: US 6,756,304 B1
(45) Date of Patent: Jun. 29, 2004

(54) METHOD FOR PRODUCING VIA-CONNECTIONS IN A SUBSTRATE AND SUBSTRATE EQUIPPED WITH SAME

(75) Inventor: Philippe Robert, Arcueil Cedex (FR)

(73) Assignee: Thales Avionics S.A., Velizy Villacoublay (FR)

(*) Notice: Subject to any disclaimer, the term of this patent is extended or adjusted under 35 U.S.C. 154(b) by 0 days.

(21) Appl. No.: 10/030,157

(22) PCT Filed: Jul. 18, 2000

(86) PCT No.: PCT/FR00/02065
§ 371 (c)(1),
(2), (4) Date: Jan. 30, 2002

(87) PCT Pub. No.: WO01/09944
PCT Pub. Date: Feb. 8, 2001

(30) Foreign Application Priority Data

Jul. 30, 1999 (FR) .............................. 99 09938

(51) Int. Cl.⁷ ..................... H01L 21/44; H01L 23/48
(52) U.S. Cl. ................ 438/667; 438/629; 438/637; 438/668; 438/672; 438/675; 257/774
(58) Field of Search ................ 438/629, 637, 438/639, 640, 667, 668, 672, 675; 257/774; 365/196, 207, 230.06

(56) References Cited

U.S. PATENT DOCUMENTS

| | | | | |
|---|---|---|---|---|
| 4,566,186 A | * | 1/1986 | Bauer et al. ................ 29/852 |
| 4,978,639 A | | 12/1990 | Hua et al. | |
| 5,056,216 A | * | 10/1991 | Madou et al. ............... 29/843 |
| 5,343,071 A | * | 8/1994 | Kazior et al. ............... 257/621 |
| 5,674,785 A | * | 10/1997 | Akram et al. ................. 438/15 |
| 6,013,948 A | * | 1/2000 | Akram et al. ............... 257/698 |
| 6,271,135 B1 | * | 8/2001 | Palmans et al. ............ 438/687 |
| 6,392,158 B1 | * | 5/2002 | Caplet et al. ............... 174/255 |
| 6,475,889 B1 | * | 11/2002 | Ring .......................... 438/571 |

FOREIGN PATENT DOCUMENTS

| | | | | |
|---|---|---|---|---|
| EP | 0 926 726 | | 6/1999 | |
| JP | 63-193545 | * | 8/1988 | ........ 148/DIG. 135 |

OTHER PUBLICATIONS

Arai (JP63-193545), Aug. 1988, English Abstract.*
A. Guldan et al.: "Method for producing via-connections in semiconductor wafers using a combination of plasma and chemical etching" IEEE Transactions on Electron Devices, US, IEEE Inc., vol. ED-30, No. 10, pp. 1402-1403.

* cited by examiner

Primary Examiner—Maria Guerrero
(74) Attorney, Agent, or Firm—Oblon, Spivak, McClelland, Maier & Neustadt, P.C.

(57) ABSTRACT

A method of fabricating conducting through-connections in a substrate, and a substrate equipped with such connections. The method of fabricating conducting through-connections between the front face and the rear face of a substrate hollows into the substrate, from the rear-face side, cavities having a depth and a cross-section that are defined so as to delimit studs of defined cross-section, which are intended to provide for electrical conduction between the front and rear faces, and filling in the cavities with a dielectric material. The substrate is equipped with conducting through-connections between its front face and its rear face. The conducting connections are provided by way of studs delimited by cavities filled in with a dielectric material. Such a method and substrate may find application, in particular, to substrates used for the fabrication of microsensors.

12 Claims, 3 Drawing Sheets

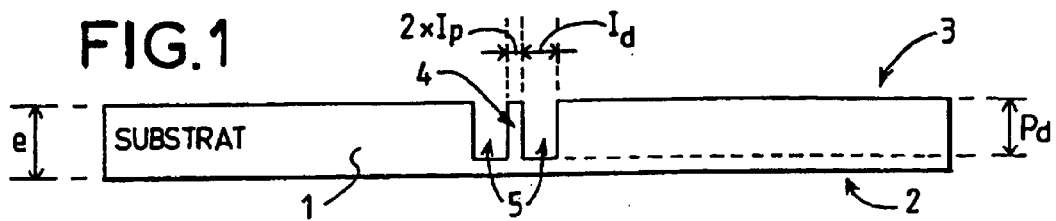
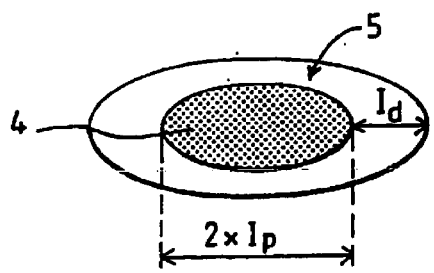
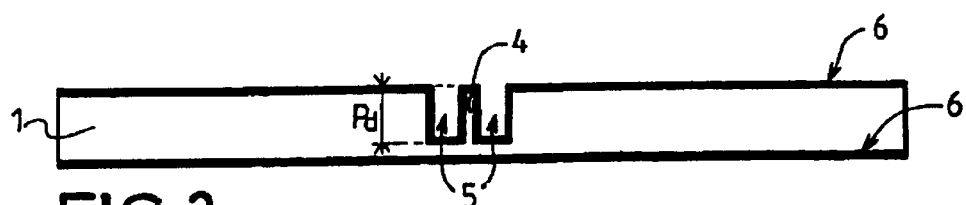
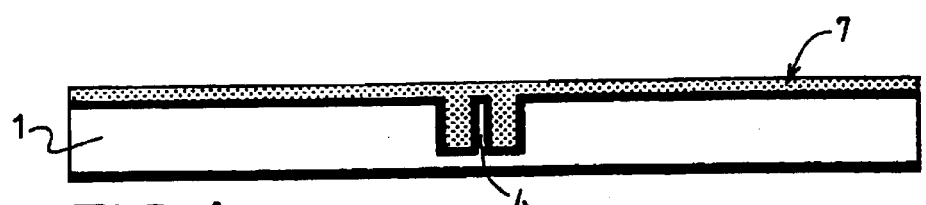
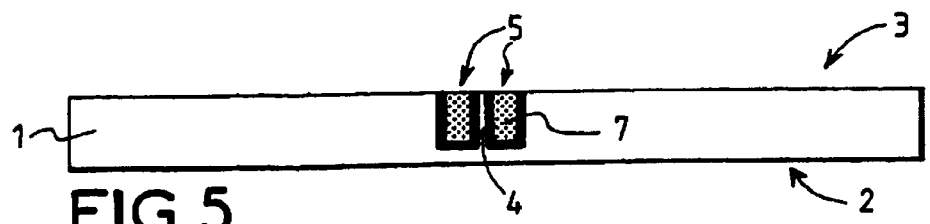

METHOD FOR PRODUCING VIA-CONNECTIONS IN A SUBSTRATE AND SUBSTRATE EQUIPPED WITH SAME

TITLE OF THE INVENTION

The invention relates to a method of fabricating conducting through-connections between the front face and the rear face of a substrate, as well as a substrate equipped with such conducting connections.

BACKGROUND OF THE INVENTION

The invention applies especially to substrates intended to accommodate a microelectronics structure, such as a sensor, a magnetic head or a microactuator, or intended to accommodate a microelectronics circuit.

The substrate may be electrically conducting (for example made of silicon, or of polysilicon) or insulating (for example made of ceramic).

The conducting through-connections make it possible to provide discrete electrical contacts between the front face and the rear face of a semiconducting, insulating or conducting substrate.

The use of conducting through-connections makes it possible:

to have a denser number of electrical contacts, to provide electrical contacts over a stack of substrates, to supply the components electrically from the rear face of the substrate when the wiring cannot be done on the front face.

The technique widely used to fabricate these conducting connections consists in piercing the substrate from front to back (for example by laser firing), in electrically insulating the hole (in the case of a semiconducting or conducting substrate) and in filling in the hole with a conducting material.

In the majority of applications, the filling of the holes has to be complete in order to allow the electrical contact to be picked up easily, in order to continue the technological stages relating to the front and rear faces after the fabrication of the conducting connections and in order to allow the electrical contact to be taken up after any thinning of the substrate at the end of the process.

The filling is generally done with a conducting paste injected under pressure (method used to form microelectronics packages). Although effective, this technique is fairly "violent" and gives rise to defects on the faces of the substrate (splinters, roughness, cracks, stresses, etc). This technique can even entail a loss of insulation in the case of semiconducting substrates. Furthermore, the paste is made up of metallic particles mixed with a solution based on polymers and solvents. This solution, which serves as a binder, has to be removed after filling. This removal causes a not inconsiderable shrinkage of the conducting material which can be the origin of holes which are responsible for loss of conduction. The paste may also be the origin of contamination, the polymers being difficult to remove.

Other techniques have been envisaged, in particular those described in the document "Electrical Interconnections Through Semiconductor Wafers" by T. R. Anthony, published in the magazine Journal Application of Physic 52(8) of August 1981. It covers:

the use of electrolysis methods, which generally lead to a surface filling of the hole due to problems of wetting and of edge effects or the filling by a molten metal. This technique poses problems of thermal expansion. Metals with a low melting point (below the softening temperature of the substrate) exhibit a high coefficient of thermal expansion, often much higher than the substrate. This results in difficulties of a mechanical nature (stresses) or technological nature (risk of cracking of the deposited layers).

One of the objects of the invention is to alleviate the abovementioned drawbacks.

To that end, the subject of the invention is a method of fabricating conducting through-connections between the front face and the rear face of a substrate. The method consists:

in hollowing into the substrate, from the rear-face side, cavities having a depth and a cross section which are defined so as to delimit studs of defined cross section which are intended to provide for electrical conduction between the two faces and in filling in the cavities with a dielectric material.

A further subject of the invention is a substrate equipped with conducting through-connections between its front face and its rear face. The conducting connections consist of studs delimited by the hollowing of cavities, in the rear face of the substrate. These cavities are filled in with a dielectric material.

The method consists in forming the conducting through-connections by delimiting in the substrate (semiconducting, insulating or conducting substrate) studs which will serve as conducting passages between the rear face and the front face of the substrate. The delimiting is performed by hollowing out cavities. The cavities are filled in with a dielectric material in order to provide for the mechanical strength and the electrical insulation of the studs.

The use of an insulant as a material for filling the hollowed cavities presents the advantage of offering a coefficient of thermal expansion close to that of the substrates widely used in microelectronics.

Furthermore, after filling, a thinning of the substrate on the two faces makes it possible to remove the short circuits due to the substrate and the surpluses of filling material.

The invention moreover has the advantage that it allows:

easy picking-up of the electrical contact, even after thinning of the substrate, and very good electrical insulation of the conducting passages.

The substrate may be insulating (for example of ceramic) or slightly conducting (for example of lightly doped semiconductor). In these cases a metallic deposit is formed or can be formed on the studs before filling of the cavities in order to provide the electrical conductivity of the studs.

In the case of the use of a silicon substrate of silicon-on-insulator type, better known by the acronym SOI, the thinning of the substrate which is intended to cut the short circuits after filling can be replaced by etching of the silicon and oxide layers on the front-face side in order to make the studs show through.

A substrate equipped with conducting through-connections which are obtained by a method according to the invention can play a part in delimiting an enclosure. The substrate may make it possible to seal the enclosure in such a way that the atmosphere in the enclosure is perfectly defined with, in particular, a pressure capable of being used as a reference pressure. The leaktightness of the substrate is not in any way affected by the conducting through-connections consisting of the studs. This is because, on the one hand, the conducting through-connections obtained by a method according to the invention leave the front face of the substrate perfectly flat and, on the other hand, the dielectric material fills in the cavity in a completely hermetic way. The possibility of being able to carry out sealing plays a vital role, in particular for the fabrication of microsensors.

BRIEF DESCRIPTION OF THE DRAWINGS

Other characteristics and advantages of the invention will emerge with the aid of the description which follows. The description is given with regard to the annexed figures which represent:

FIG. 1, a substrate on completion of a first stage of the method,

FIG. 2, a magnification of a stud,

FIG. 3, a substrate on completion of a second stage of the method,

FIG. 4, a substrate on completion of a third stage of the method,

FIG. 5, a substrate on completion of a fourth stage of the method,

DETAILED DESCRIPTION

Figure 6:
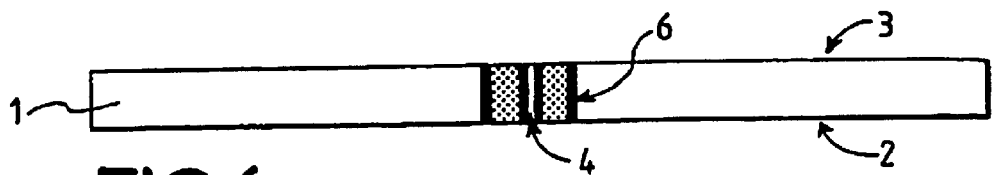
FIG. 6, a substrate on completion of a fifth stage of the method.

FIG. 1 represents a substrate 1 having a front face 2 and a rear face 3. The substrate 1 is usually of silicon, but it may be of another type, ceramic for example. The method according to the invention applies equally well to a slightly conducting substrate (a semiconductor such as silicon, possibly doped), and to an insulating (ceramic) substrate or else to a conducting substrate.

The first stage of the method consists in delimiting studs 4 in the substrate 1. These studs 4 are intended to provide an electrical connection through the substrate 1. The studs 4 are advantageously formed in the substrate 1 itself.

The delimiting of a stud 4 is performed by hollowing out a cavity 5 in the rear face 3 of the substrate 1. According to the example of FIG. 1, the cavity 5 has a ring-shaped circular cross section. This ring has a width $I_d$ and a diameter $2 \times (I_p + I_d)$ with a solid part of diameter $2 \times I_p$ which constitutes the stud. The cavity 5 has a depth Pd less than the thickness e of the substrate 1. The cross section of the cavity 5 may not be circular, but square, rectangular, etc. The same goes for the cross section of the stud 4, the cross section of the stud possibly being of a different shape to that of the cavity.

The hollowing of a cavity 5 is achieved by known techniques. One of the known techniques consists, with the aid of a mask, for example, made of resin or of oxide, in carrying out dry anisotropic etching. Another known technique consists, with the aid of a mask, in carrying out chemical etching. For a silicon substrate of thickness e=525 μm, the depth $P_d$ of the cavity 5 is of the order of 300 μm. For a ceramic substrate, the hollowing is generally performed by mechanical machining of the substrate.

FIG. 2 is a magnification of a stud. The stud 4, of diameter $2 \times I_p$, is delimited by the cavity 5 in the shape of a cylindrical ring of width $I_d$. For example, the stud 4 has a diameter $2 \times I_p$=50 μm and the cavity 5 a width $I_d$=50 μm.

FIG. 3 illustrates the second stage of the method. This second stage is optional; it is necessary when the substrate 1 is not sufficiently conducting, for example in the case of a ceramic substrate. This stage consists in carrying out the depositing of a thin conducting layer 6 which has the function of increasing the conductivity of the stud. Depending on the technique used to carry out the deposition, the layer 6 is deposited only on the rear face or else simultaneously on the two faces.

The technique used should allow a deposition over the entire height $P_d$ of the stud. On completion of this stage, the surface of the rear face, and possibly of the front face, is completely covered with a thin conducting layer; the surface of the rear face comprising the surface of the studs 4 as far as the bottom of the cavities 5. A technique of chemical deposition in vapor phase, for example of tungsten (W), makes it possible to obtain a deposition of a conducting layer 6 in accordance with the above description. Such a technique is known by the acronym CVD, an abbreviation of the term Chemical Vapor Deposition.

FIG. 4 illustrates the third stage of the method. The cavities 5 are filled in with a defined material 7. The material 7 should be insulating or only slightly conducting in order to insulate the stud from the rest of the substrate 1 when the latter is conducting. The deposition technique consists typically in deposition by melting. The method makes it possible to use materials having a low coefficient of thermal expansion. The material may advantageously have a coefficient of thermal expansion very close to that of the silicon, in the case of a silicon substrate, while having a melting temperature less than that of the silicon. The low coefficient of thermal expansion makes it possible to avoid the awkward problems relating to the difference in coefficient of thermal expansion between the filling material and the substrate; problems with which certain known connection techniques are confronted.

The material adopted may be glass, deposited by melting.

The material 7, in addition to an insulation function which is necessary when the substrate is conducting, performs a function of retention of the stud 4. The material 7 integrates the stud 4 over its height with the substrate 1. The material 7 may, moreover, participate in delimiting a sealed enclosure.

Depending on the deposition techniques used, the material deposited may cover the whole of the rear face as FIG. 4 illustrates.

FIG. 5 illustrates the fourth stage of the method.

This stage makes it possible to uncover the substrate by removing the unwanted surface layers. When the dielectric 7 overflows from the cavities 5, it has to be removed by thinning the rear face 3 of the substrate 1. The thinning may consist of a lapping, polishing, etching or a combination of these various techniques. Lapping consists in abrasion which has the drawback of leaving a surface having a scratched surface state. In order to remedy this drawback, the abrasion is followed by polishing in order to obtain a smooth surface state. One polishing technique is widely known by the acronym CMP, an abbreviation of the term Chemical Mechanical Planarization. This technique has a double effect, mechanical and chemical, which makes it possible to obtain a smooth surface. The polishing is particularly important when the second stage has not been implemented, that is to say when there has been no deposition of a conducting layer. The etching may consist of dry or wet etching. Dry etching employs a plasma, wet etching employs a chemical bath.

The thinning described above may make it possible to remove the conducting layer (deposited during the second stage) from the rear face 3 and from the front face 2 if the conducting layer is present on the latter. The removal of the conducting layer can be carried out in an independent or supplementary way by a known specific technique, for example by dry etching or wet etching. The dry etching may be of the RIE type, an abbreviation of the term Reactive Ion Etching.

On completion of the fourth stage, the substrate comprises a set of studs 4. This set may comprise a single stud 4. The maximum density of studs capable of being delimited in a substrate of given size depends, in particular, on the performance of the etching technique used during the first stage. The cavities 5, filled in with a dielectric material 7, provide the mechanical strength and the electrical insulation of the studs 4. The material 7 may, moreover, participate in delimiting a sealed enclosure. The use of a dielectric as a material for filling the hollowed cavities presents the advantage of offering a coefficient of thermal expansion similar to that of the substrates widely used in microelectronics. The method makes it possible to solve the problems relating to the difference in coefficient of thermal expansion between the substrate and the filling material. The method overcomes problems of removal and of contamination, moreover.

The fifth stage, FIG. 6, makes it possible to eliminate the short circuit between the stud 4 and the front face 2 of the substrate 1. The elimination is performed by a thinning of the front face according to a known technique. A first technique may consist in lapping, by abrasion, the front face 2 of the substrate 1; a second technique may consist of dry or wet etching; a third technique may consist of a combination of lapping, etching and polishing. The studs 4, possibly metallized 6, are conducting elements which make it possible to establish electrical through-connections between the two faces 2, 3 of the substrate 1. The front face 2 of the substrate 1 is generally intended for the installation of an electronic function or of a microstructure, a microsensor for example. The studs 4 make it possible, for example, to supply the microsensor electrically via the rear face 3 by providing an electrical connection between the rear face 3 and points of contact within the circuit of the microsensor. The studs 4 make it possible to have available contact points which do not affect the flatness of the surface of the front face 2 of the substrate 1. A substrate 1, equipped with studs 4 obtained according to a method according to the invention, may contribute to delimiting an enclosure. The substrate may make it possible to achieve sealing of the enclosure in such a way that the atmosphere in the enclosure is perfectly defined with, in particular, a pressure possibly being used as a reference pressure. The leaktightness of the enclosure is not in any way affected by the conducting through-connections consisting of the studs. In fact, on completion of the fifth stage, the front face 2 of the substrate 1 is perfectly flat.

Figure 7:
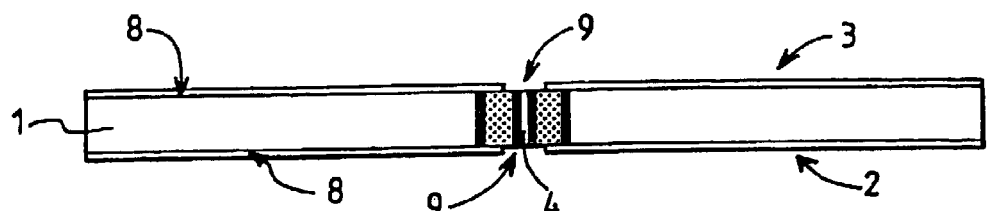
FIG. 7, a substrate on completion of a sixth stage of the method.

The sixth stage, FIG. 7, consists in depositing a thin insulating layer 8 on the two faces 2, 3 of the substrate 1 and in opening up contact regions 9 opposite the studs 4. The deposition of a thin insulating layer 8 is performed by a known technique, for example of the plasma type such as the technique known by the acronym PECVD, an abbreviation of the term Plasma Enhance Chemical Vapor Deposition.

The opening of the contact regions 9 can be performed by masking and etching of the insulating layer 8. The masking can be carried out by photolithography.

Figure 8:
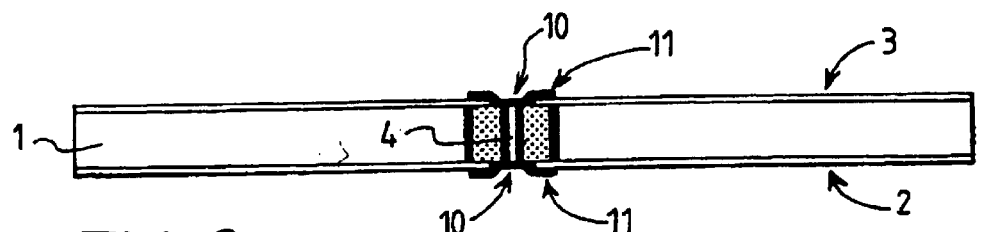
FIG. 8, a substrate on completion of a seventh stage of the method.

The seventh stage, FIG. 8, consists in physically forming the points 10 of contact opposite the studs 4. The physical forming is carried out by known techniques which consist in depositing a thin conducting layer 11 on the two faces 2, 3 of the substrate 1 and in cutting out the points 10, for example by masking and etching of the conducting layer 11. The masking can be carried out by photolithography.

FIGS. 9 to 14 illustrate an implementation of the method with a substrate consisting of a stack of layers. This substrate 1 may be of SOI type, an abbreviation of the term Silicon On Insulator. The first layer 12 of the stack consists of silicon. The free face of the first layer corresponds to the rear face 3 of the substrate. The second layer 13 of the stack is an insulating layer. It consists of a silicon oxide. The third layer 14 of the stack consists of silicon. Its free face corresponds to the front face 2 of the substrate. An SOI substrate has the following thicknesses, for example:

$1^{st}$ layer: 500 $\mu$m $2^{nd}$ layer: 0.4 $\mu$m $3^{rd}$ layer: from 0.2 $\mu$m to several $\mu$m.

The third layer 14 is generally reserved for the fabrication of electronic functions or for the implementation of microstructures, for example a microsensor, a microactuator, etc.

Figure 9:
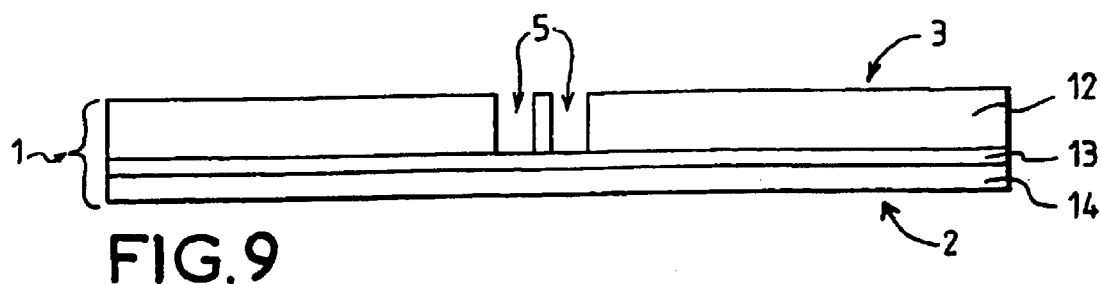
FIGS. 9 to 14, the stages of the method implemented with a substrate consisting of a stack of layers.

FIG. 9 illustrates the first stage of the method. According to this implementation, the cavities 5 are hollowed until the insulating layer 13 is uncovered.

When the method is implemented with a substrate of SOI type, the second stage does not exist.

Figure 10:
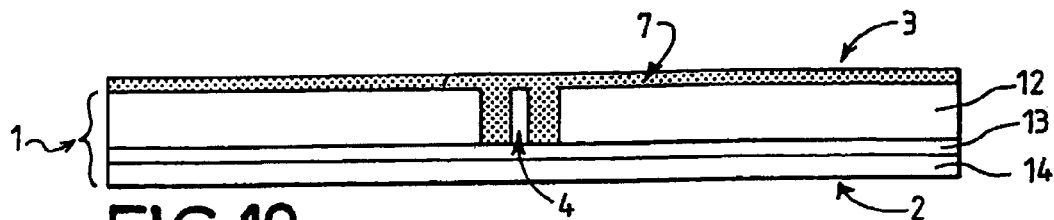

FIG. 10 illustrates the third stage of the method. The type of substrate does not alter the implementation of the third stage; this stage progresses according to the description given with regard to FIG. 4.

Figure 11:
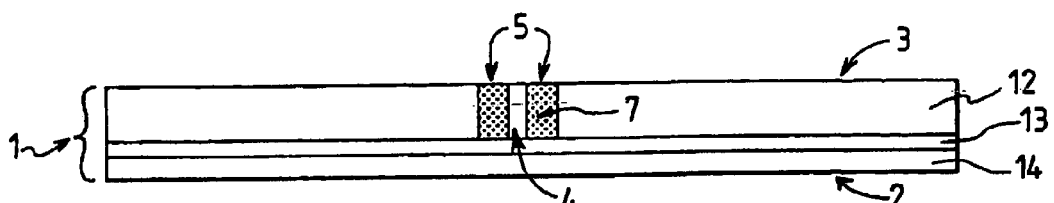

FIG. 11 illustrates the fourth stage of the method. The type of substrate does not alter the implementation of the fourth stage; this stage progresses according to the description given with regard to FIG. 5.

When the method is implemented with a substrate consisting of a stack of layers, in particular of the SOI type, the fifth stage does not exist.

Figure 12:
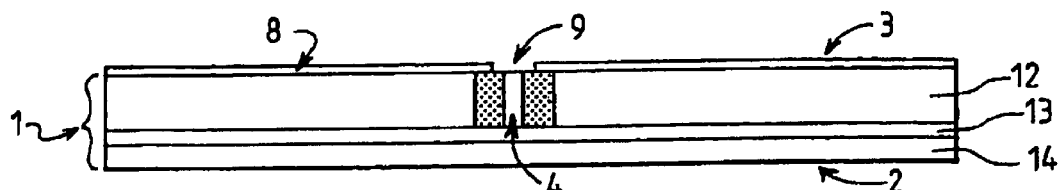

FIG. 12 illustrates the sixth stage of the method. Given that the studs 4 are not visible on the front face 2, the depositing of the thin insulating layer 8 is performed only on the rear face 3. The depositing progresses according to the description given with regard to FIG. 7, with, as a limitation, a deposition on the rear face 3.

Figure 13:
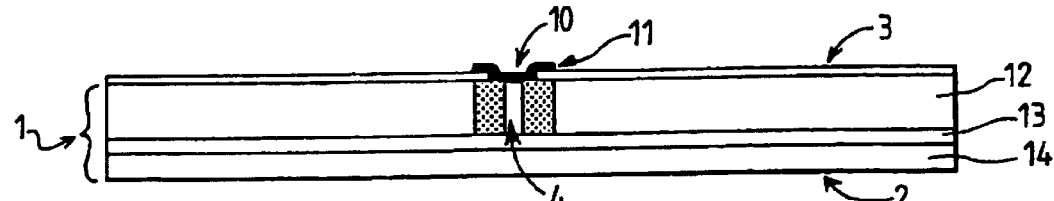

FIG. 13 illustrates the seventh stage of the method. The implementation is different from that described with regard to FIG. 8 to the extent that the points 10 of contact are present only on the rear face 3.

Figure 14:
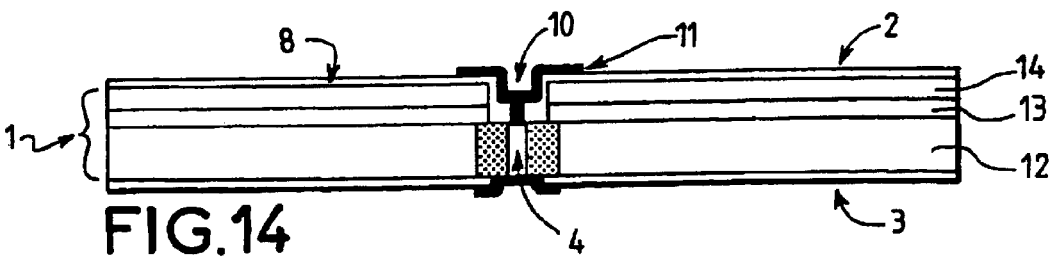

In order to obtain a through-stud, supplementary stages are necessary. They are illustrated by FIG. 14. They consist:

in etching the third layer 14 and the second layer 13 from the front face 2 by using a mask. The etching is carried out as far as the stud 4, according to a technique identical to that described with regard to FIG. 1, in order to uncover the stud and only a part of the dielectric.

in physically forming the points 10 of contact on the front face 2 according to a technique similar to that described with regard to FIG. 13. In the case of the points 10 of contact on the front face, the cross section of etching of the insulating layer 8 is less than the cross section of etching of the third and second layers of the substrate.

What is claimed is:

1. A method of fabricating conducting through-connections between a front face and a rear face of a substrate, comprising:

hollowing into the rear face of the substrate a cavity that surrounds a stud of substrate material formed by the cavity that provides for electrical conduction between the front and rear faces;

filling in the cavity with a dielectric material to insulate the stud from a rest of the substrate and to integrate the stud with the substrate while allowing the stud to show through the rear face;

hollowing the front face of the substrate opposite each stud so as to make the stud show through the front face thereby converting the stud into a conducting through-connection; and physically forming points of contact at each end of the stud showing through the substrate by depositing a conducting material, insulated from the substrate, on each of these ends.

2. The method of fabricating conducting through-connections between the front face and the rear face of a substrate as claimed in claim 1, wherein the filling of the cavity comprises:

depositing the dielectric material in the cavity; and removing, from a surface of the substrate, overflows of the deposit of dielectric material by thinning the rear face of the substrate until the stud is uncovered.

3. The method of fabricating conducting through-connections between the front face and the rear face of a substrate as claimed in claim 1, further comprising, after forming the stud and before filling in the cavity:

metallizing the stud by depositing a conducting layer on the stud.

4. The method of fabricating conducting through-connections between the front face and the rear face of a substrate as claimed in claim 3, wherein the filling-in of the cavity comprises:

depositing the dielectric material in the cavity;

removing, from a surface of the substrate, overflows of the deposit of the dielectric material by thinning the rear face of the substrate until the stud is uncovered; and removing the conducting layer from the surface of the substrate, by thinning of the metallized faces of the substrate.

5. The method of fabricating conducting through-connections between the front face and the rear face of a substrate as claimed in claim 1, further comprising:

thinning the substrate until the dielectric material contained in the cavity is uncovered so as to make the stud show through on the front face of the substrate.

6. The method of fabricating conducting through-connections between the front face and the rear face of a substrate as claimed in claim 1, further comprising:

hollowing the front face of the substrate opposite the stud until the dielectric material contained in the cavity is reached, so as to make the stud show through on the front face of the substrate.

7. The method of fabricating conducting through-connections between the front face and the rear face of a substrate as claimed in claim 1, wherein the physical formation of the points of contact comprises:

depositing an insulating layer on a same side as the faces of the stud showing through;

opening up a contact region opposite each face of the stud showing through by masking and etching of the insulating layer;

depositing a conducting layer on the same side as the faces of the stud showing through; and cutting out the points of contact by masking and etching of the conducting layer.

8. The method of fabricating conducting through-connections between the front face and the rear face of a substrate as claimed in claim 1, wherein the dielectric filling material is glass.

9. The method of fabricating conducting through connections between a front from a rear face of a substrate as claimed in claim 1, wherein said hollowing into the substrate, said filling in the cavity, said hollowing the front face of the substrate, and said physically forming steps are performed at a plurality of areas of the substrate in order to form a plurality of conducting-through connections.

10. A substrate of silicon equipped with a conducting through-connection between a front face and a rear face of the substrate, wherein;

the conducting through-connection comprises a stud of the substrate of silicon that extends over an entire height of the substrate and is surrounded by a dielectric material which delimits the stud and keeps the stud integral with the substrate, the stud showing through on the front and rear faces of the substrate, and points of contact being formed opposite each face showing through of the stud by a conducting material insulated from the substrate.

11. The substrate as claimed in claim 10, wherein the silicon stud is coated substantially over its entire height by a conducting metallization that is surrounded by the dielectric material.

12. The substrate as claimed in claim 10, wherein said substrate comprises a plurality of said through-connections.

* * * * *